United States Patent [19]

Brack

[11] 4,303,696
[45] Dec. 1, 1981

[54] RADIATION CURING OF PREPOLYMER COATING COMPOSITIONS

[75] Inventor: Karl Brack, Holliston, Mass.

[73] Assignee: Design Cote Corp., Westminster, Mass.

[21] Appl. No.: 177,001

[22] Filed: Aug. 11, 1980

Related U.S. Application Data

[62] Division of Ser. No. 835,477, Sep. 21, 1977, Pat. No. 4,218,294, which is a division of Ser. No. 575,252, May 7, 1975, Pat. No. 3,989,609.

[51] Int. Cl.$^3$ ................................................ B05D 3/06
[52] U.S. Cl. .................................. 427/44; 204/159.13; 204/159.14; 204/159.15; 204/159.18; 204/159.19; 204/159.22; 204/159.23; 204/159.24; 427/54.1
[58] Field of Search ...................... 204/159.14, 159.19, 204/159.22, 159.23, 159.24, 159.13; 260/28, 33.60 B, 28.5 R; 427/44, 54.1

[56] References Cited

U.S. PATENT DOCUMENTS

| | | | |
|---|---|---|---|
| 2,141,575 | 12/1938 | Warp | 260/28 X |
| 3,171,825 | 3/1965 | Mark | 260/28 X |
| 3,822,227 | 7/1974 | Hermann et al. | 260/28.5 A |
| 3,864,133 | 2/1975 | Hisamatsu et al. | 204/159.15 X |
| 4,146,452 | 3/1979 | Weber et al. | 204/159.14 |
| 4,210,713 | 7/1980 | Sumiyoshi et al. | 204/159.19 X |

*Primary Examiner*—Norman Morgenstern
*Assistant Examiner*—Thurman K. Page
*Attorney, Agent, or Firm*—George E. Kersey

[57] ABSTRACT

Release coatings are provided by including in a liquid monomer or prepolymer polymerizable by electromagnetic or ionizing radiation a waxy material of limited compatibility therein. Upon application of a film of such material by casting, coating or printing, a thin layer of the waxy material migrates to the surface to provide, after cure, the desired release properties. The thin surface layer of waxy material also tends to exclude oxygen from the film to permit radiant curing in air. Preferably the polymerizable liquid comprises acrylate monomers with or without unsaturated prepolymers copolymerizable therewith dissolved therein. Novel prepolymers especially useful for providing release films and other radiation curable coatings are described, including the reaction product of polyamides, containing primary and secondary amine groups with unsaturated polybasic carboxylic acids and particular reaction products of polyether triols with toluene diisocyanate, modified with unsaturated monomers. Also described is the inclusion in the polymerizable liquid of a dispersed substantially linear polymer as shrink control and reinforcing agent.

13 Claims, No Drawings

RADIATION CURING OF PREPOLYMER COATING COMPOSITIONS

CROSS-REFERENCE TO RELATED APPLICATION

This is a division of Ser. No. 835,477, filed Sept. 21, 1977, now U.S. Pat. No. 4,218,294, which is a divisional of U.S. Ser. No. 575,252 filed May 7, 1975 for "RADIATION CURABLE COATINGS", now U.S. Pat. No. 3,989,609, which issued Nov. 2, 1976.

BACKGROUND OF THE INVENTION

This invention relates to radiation curable and radiation cured coatings such as cast films, inks, varnishes and release coatings, methods of making the same, and prepolymer materials suitable for making such coatings. These coatings are curable by ultraviolet radiation as well as by plasma arc and an electron beam radiation, which for the present purposes shall be deemed to be a form of radiation curing.

Coatings and inks for paper, foil, film, panels, tiles and the like are desired which can be readily applied and which, after application, are tough, flexible, solvent resistant and abrasion resistant. Elimination of solvents to reduce cost, to avoid pollution, and to achieve improved properties is desirable. Release surfaces of low adhesion are useful for transfer printing, for temporary protective cover sheets for pressure-sensitive adhesives, and to facilitate handling of multiple articles in machinery or the like.

Known radiation curable coatings useful for other purposes have been deficient in one or more of the above described criteria. Either they have required long exposures to radiation, especially ultraviolet light, or they have limited strength, abrasion and solvent resistance. Suitable release coatings heretofore known have required use of materials such as waxes or resins which inherently have release properties and have been applied as hot-melts or solvent solutions.

OBJECTS OF THE INVENTION

It is one object of the present invention to provide release surfaces which can employ a wide variety of film-forming materials and which can be readily applied without substantial solvent and quickly cured by radiation, generally in one second or less under moderate exposure.

It is a further object of the present invention to provide novel radiation curable materials, and coatings resulting therefrom, which cure rapidly under moderate exposure to give films with a desirable combination of toughness, flexibility and resistance to solvents and to abrasion. Such films are useful as inks, release coatings, protective varnishes or the like.

DESCRIPTION OF THE INVENTION

As more fully described hereinafter, a valuable new class of release materials is provided by including oily or waxy materials in a radiation curable, film-forming liquid in which these materials have limited compatability such that a thin layer thereof will migrate to the surface of a thin film of the liquid prior to cure. The materials have good slip or release properties, are generally lipophilic, and can comprise waxes, silanes, siloxanes, silicones, fluorocarbons, and the like. While generally non-reactive in the polymerizable liquid, they can contain reactive groups. For example, stearyl acrylate can be used with acrylate monomers and will migrate to the surface and orient with the stearyl groups toward the surface prior to reaction, and the acrylate groups will coreact with the cross-linking acrylates. The quantity of oily or waxy materials is not critical, provided enough is used to be effective, generally between about 0.1 and 10% by weight of the film-forming liquid. Undue excess should be avoided to avoid property degradation in the film. About 0.5 to 4.0% by weight is usually most preferred.

The use of waxes in radiation curable liquids has been considered in the prior art to form an oxygen barrier at the surface to facilitate curing in air, but, as stated, for example in U.S. Pat. No. 3,864,133, the result is unsatisfactory. However, we have found that some oily or waxy materials when added in small amounts will considerably shorten the necessary exposure time to actinic radiation for cure, e.g. stearyl acrylate, cyclododecane, low molecular weight vinylidene chloride acrylonitrile copolymers, etc. Also, so far as is known, it has not heretofore been appreciated that such materials can advantageously be used to form dry-stripping (non-melting) release layers in separable laminates of pressure-sensitive adhesives, transfer designs, or the like. Furthermore, the addition of some of these oily or waxy materials will lead to cured coatings with excellent vapor barrier properties (e.g. oxygen, water, etc.). Such coatings are desirable, for instance, on plastic bottles, tubs, containers in general for food. Some of the most desirable additives for this purpose are low molecular weight vinylidene chloride acrylonitrile copolymers, fluorocarbon oil or waxes, cyclododecane.

The oily or waxy materials above described can be incorporated in any suitable radiation curable liquid including addition polymerizable monomers and prepolymers having ethylenic unsaturation, such as acrylate monomers and polyurethane/acrylate prepolymers, polyamides with a plurality of reactive amine groups reacted with ethylenically unsaturated polybasic carboxylic acids, acrylated epoxides and epoxide resins, also radiation curable systems consisting of unsaturated groups and thiol groups (e.g. U.S. Pat. No. 3,950,569) catalytically polymerized with catalysts all as more fully described hereinafter and in the Examples.

Preferred radiation curable liquids for use in this invention comprise an unsaturated prepolymer mixed with acrylic monomers and additives as further described below. Suitable unsaturated prepolymers are unsaturated polyether-polyurethane prepolymers prepared by reacting polyether polyols with bis-or polyisocyanates, including aromatic and aliphatic, and an unsaturated reagent or by reacting reactive polyamides with dicarboxyalkenes, their anhydrides or their esters. In the preparation of these prepolymers a step of driving off volatile materials such as solvents can be avoided if an acrylic monomer is used as the solvent (i.e. a monomer which normally would be admixed in the succeeding formulation step). Sometimes an agent for inhibiting further polymerization (depending upon the nature of the prepolymer) is present.

The prepolymers, which in some cases already contain an acrylic ester reagent, if an acrylic monomer is used as a solvent and/or if an excess of acrylic hydroxyalkyl ester was used in the prepolymer preparation, are then compounded on a mill with a further quantity of unsaturated reagent, in this case one or more acrylic or methacrylic esters (whether or not the same unsaturated reagent was used in preparing the prepolymer). Additives, as further described below, are approximately added at this formulating stage. After milling the material is spread as a film and then irradiated briefly to cure it.

The preferred modified polyester polyurethane comprises reacting one isocyanato group of toluene diisocyanate (TDI) with a polyether triol, three mols TDI per mol of triol, and then reacting at least a part and preferably all of the other remaining isocyanato groups with an ethylenically unsaturated, reactive hydrogen containing compound copolymerizable with the acrylate monomers. TDI is a particularly suitable aromatic and isophoronediisocyanate is a particularly desirable aliphatic because their two isocyanato groups have different reactivities, facilitating this stepwise condensation. Polyethers based on polypropylene oxide are the preferred triols and trimethylol propane condensed with propylene oxide with a molecular weight between about 300–4500, preferably 700–1500, is most preferred. Hydroxyl-lower alkyl acrylate or methacrylate are the preferred active hydrogen containing unsaturated compounds. It is further preferred that essentially all isocyanato groups remaining after condensation with triol be so reacted. It has been discovered that such prepolymers polymerize readily and rapidly under radiation to form inks and coatings with an excellent combination of properties. Such preferred prepolymers are shown in the Examples, particularly Examples 1–9 and comprise condensation of 1 mol of triol with 3 mols TDI and substantially 3 mols of hydroxy-lower alkyl acrylate (or methacrylate).

It has been found that prepolymer materials of this invention cure extremely well with ultraviolet light and with electron beams. The films of the order of one mil or less cure readily with ultraviolet light. Thick films may require more penetrating radiation, particularly if a pigment is present, and for these plasma arc radiation, electron beam radiation, or X-rays are desirable.

The preparation of unsaturated polyether-polyurethane prepolymers for making radiation curable coatings in accordance with the invention begins with reacting a diisocyanate with a polyol at a temperature not exceeding 75° C. in the presence of a catalyst chosen for a low degree of promotion of side reactions. Stannous octoate is preferred as a catalyst. Stannous butyrate and stannous laurate have also been found usable. Because of the high viscosity of the reaction product, the reaction is carried out in a solvent. The solvent may be either a hydrocarbon such as toluene, in which case it must be removed by evaporation later, or it may be an acrylate material of the class of materials suitable for use in ink and coating formulations, in which case the solvent may be allowed to remain in the product. Examples of the latter type of acrylate monomer solvents are: trimethylolpropane triacrylate, 1,6-hexanediol-diacrylate, 1,3-butanediol diacrylate, neopentylglycol diacrylate, pentaerythritol tetramethacrylate, etc. The solvent must be dry to avoid the production of by-products.

The reaction in the solvent is carried out in a vessel equipped with an agitator and blanketed with nitrogen or dry air. The mixture is stirred at room temperature as the polyol is added to the diisocyanate and the addition is carried out at such a rate that with the available water cooling the temperature of the reaction mixture does not rise above 50° C. Then, after an hour or so of maintaining the reaction mixture at 50° C. or just below that temperature, when approximately one half of the available isocyanate groups have been used up (as determined by titration of aliquots), an unsaturated hydrocarbon bearing a hydroxyl group, either an alcohol or a hydroxy ester, is added, preferably somewhat in excess, as for example 10% in excess, of the amount needed to react with those isocyanate groups which are left unreacted after the reaction with the polyether polyol. At this point it is preferable to switch from blanketing the reaction mixture with dry nitrogen to blanketing with dry air (oxygen is a good polymerization inhibitor). During this addition the reaction mixture may be permitted to rise to 75° C., but no further. After the addition is terminated, the temperature is raised to 90° C. and after an hour or so, when the isocyanate concentration has decreased to the desired level, e.g. 0.1–0.2%, a small amount of p-methoxyphenol is added to inhibit premature polymerization. When a hydrocarbon solvent is to be removed, it is best to remove the solvent under reduced pressure at a temperature as low as possible, in order to avoid premature polymerization of the prepolymer. Another preferred unsaturated prepolymer is obtained by reacting ethylenically unsaturated di-or polyacids, their esters and/or anhydrides with low molecular weight polyamid-resins, containing primary and secondary amine groups along the polymer chain as well as at the ends thereof, (e.g. Emery resins by Emery Chemical Company and/or Vessamid resins by General Mills Company). Depending on the desired properties of the cured coatings, these amine groups may be reacted partly or completely with the unsaturated bis- or polyacids, esters or anhydrides. The more of the amine groups reacted, the tighter crosslinked and harder and more abrasion resistant the resulting coatings will be.

As will be made clear from the following examples, the modified prepolymer material may be an oil, with or without an acrylate ester admixture, or it may be a solid resin. The next step is to compound the modified prepolymer as above prepared with one or more acrylate monomers esters on a roller mill. It is preferred to have trimethylopropane triacrylate included as one of the components of this material, and of course sometimes this component is already there for having been used as a solvent in the previous step. Other acrylate monomer components for use at this stage are acrylated epoxidized soybean oil, hydroxyethyl acrylate, hydroxyethyl methacrylate, 1,4-butanediol diacrylate, neopentryl glycol diacrylate, pentaerythritol tetra-acrylate, pentaerythritol triacrylate, hexanediol diacrylate, tetraethyleneglycol diacrylate, vinyl acrylate, N-vinyl pyrolidone (V-pyrol by GAF Corporation), butyl acrylate, isodecylacrylate, octadecylacrylate, dimethylaminoethyl methacrylate, acrylic acid, methacrylic acid, acrylamide and/or methylene bis-acrylamide, and the like. It is preferred that the radiation curable liquid contain at least one acrylate monomer which is trifunctional (ethylenically unsaturated groups) or higher to promote cross-linking in the cured film. Acrylic monomers useful in this invention are meant to include acrylic or methacrylic acids, preferably esters thereof, and preferably esters thereof condensed with polyols, polyamines and the like to form polyacrylates, that is monomers having two or more, and preferably three or more unsaturated acrylate groups.

It is also essential to introduce at this stage a small to moderate amount of a photoinitiator for coatings to be cured by UV or plasma arc radiation (i.e., by actinic light generally). Coatings to be cured by electron beam or X-ray radiation do not require a photoinitiator. The following are suitable photoinitiators for coatings according to this invention: benzil, benzoin, benzoin alkyl esters, acyloin derivatives in general, benzophenone, acetophenone and Michler's ketone. Other compounds useful as photoinitiators for this purpose are those listed in Table 5-13, page 132, *Molecular Photochemistry* by N. J. Turro (W. Benhamin, Inc., 1967). Since acrylate monomers are essentially transparent to UV, sufficient photosensitizer should be used to permit rapid polymerization under moderate irradiation, preferably under 1 second. From about 0.5 to about 20% by weight can be used with about 5-10% by weight of coating solution being preferred.

Where a release coating or oxygen barrier is to be provided, there is introduced at this stage between one tenth of 1% and a few percent of wax, e.g., between about 0.1% and about 10% by weight, either paraffin wax, ester wax, a fluorocarbon wax or some other oily or waxy material such as a higher alkyl alcohol or acid or oleamide, or a silicon-containing material such as polysiloxane, silicone or silane or a mixture of some of these. Most of these materials are only slightly soluble in the acrylic coating formulation, and form an emulsion or a fine suspension. On curing under actinic light apparently these materials are expelled by the increasing crosslink density of the network and form a thin film on the surface of the coating. Even a small quantity of such material tends to migrate to the surface of the coating and provides a release type surface with characteristics similar to those of fluorocarbon polymers or silicones.

When the monomers added at this stage are such as to produce a mixture of low viscosity, the result is a coating material very useful as an overprint varnish. The coating can be cured by an exposure to ultraviolet radiation from a medium pressure mercury lamp for from 0.1 second to several seconds to form a hard, glossy coating. When the monomers added are such as to produce a heavy oil, the resulting material is useful for coating rigid panels, such as paperboard or veneer panels, with a film having a thickness of one to several mils. In this case ultraviolet light may be insufficient to provide quick curing and higher energy radiation can be used, such as electron beam radiation on X-rays. In the absence of air, an exposure to about 2-6 Mrad is sufficient for curing with electron beam radiation. In the presence of air, 10-20 Mrad or more are sometimes needed.

For the manufacture of inks having the desirable qualities of the coatings of the invention, pigments such as Lithol rubine pigment, molybdate orange, chrome yellow, phthalocyanine blue, carbon black or dyes are mixed in at the same time as most of the acrylic monomers. Here also it is necessary to add 5-20% of a photoinitiator to inks intended to be curable by actinic radiation, e.g. UV or plasma arc radiation, etc. The resulting ink may be printed onto paper, paperboard, plastic film, metal or other stock, and the printing can be rapidly cured by exposure for a fraction of a second to ultraviolet light from a low pressure mercury lamp. An abrasion resistant and solvent resistant printing is thereby produced, which does not require an overprint varnish.

As a further aspect of the present invention, it has been found advantageous to include in the radiation curable liquid solution an essentially linear polymer which is soluble therein, preferably one having a molecular weight of about 4,000 to the limit of solubility, and preferably between about 10,000 and 20,000. Such addition has been found to improve the physical properties of the cured films by reinforcement and to limit shrinkage. This is especially useful with acrylate monomers which may have relative high shrinkage on curing and which are highly cross-linked.

The foregoing aspects of the invention are illustrated in detail in the following examples wherein all parts are by weight. Examples 1-9 and 15-22 illustrate the preparation of prepolymers used in the formulations described in Examples 10-14 and 23-26. Examples 27-104 refer particularly to release type coatings. Examples 104-114 illustrate the advantageous inclusion of linear polymers in the radiation curable coatings. Examples 115 and 116 demonstrate the preparation of coatings with excellent oxygen barrier properties based on a radiation curable acrylic system; Examples 117 and 118 are oxygen barrier coatings based on a radiation curable epoxide system, while Examples 119 and 120 are oxygen barrier coatings based on a polyene-polythiol system.

EXAMPLE 1

522 parts 2,4-toluene diisocyanate, 500 parts dried toluene and 0.5 parts stannous octoate are placed in a vessel equipped with an agitator and blanketed with nitrogen. With stirring, a solution of 735 parts poly (propylene oxide) triol (Dow Voranol, CP 700, Hydroxyl No. 229; 0.02% $H_2O$) in 750 parts dried toluene is added at such a rate that the temperature of the reaction mixture does not exceed 50° C. The reaction mixture is stirred at 50° C. for 1 hour. Then the nitrogen blanket is replaced by a dry air blanket and 383 parts hydroxyethyl acrylate (10% excess), mixed with 100 parts of dried toluene, are added at such a rate that the temperature of the mixture does not rise above 75° C. After the addition is completed, the reaction mixture is kept stirring at 90° C. for 1 hour. 1 part p-methoxy phenol (polymerization inhibitor) is added and the solvent is removed under reduced pressure at or below 30° C. 1650 parts of a clear, colorless, resinous oil, containing a trace of toluene solvent are obtained. Analysis of this material shows 0.06% isocyanate content.

EXAMPLE 2

522 parts 2,4-toluene diisocyanate, 500 parts dried toluene and 0.5 part stannous octoate are placed in a vessel equipped with an agitator and blanketed with nitrogen. With stirring, a solution of 735 parts poly (propylene oxide) triol (Dow Voranol CP700; Hydroxyl No. 229; 0.02% $H_2O$) in 750 parts dried toluene is added at such a rate that the temperature of the reaction mixture does not exceed 50° C. The reaction mixture is stirred at 50° C. for 1 hour. Then 191.4 parts allyl alcohol (10% excess) are added at such a rate that the temperature of the mixture does not rise above 85° C. After the addition is completed, the reaction mixture is kept stirring at 90° C. for 1 hour. 1 part p-methoxy phenol (polymerization inhibitor) is added and the solvent is removed under reduced pressure at or below 30° C. 1440 parts of a clear, colorless, resinous oil, containing a trace of toluene, are obtained. Analysis of the resulting material shows 0.04% isocyanate content.

EXAMPLE 3

522 parts 2,4-toluene diisocyanate, 780 parts trimethylol propane triacrylate, and 0.5 parts stannous actoate are placed in a vessel equipped with an agitator and blanketed with nitrogen. With stirring, 735 parts of poly (propylene oxide) triol (Dow Voranol CP700; hydroxyl No. 229; 0.02% $H_2O$) are added at such a rate that the temperature of the reaction mixture does not rise above 50° C. The reaction mixture is kept at this temperature for an additional 1 hour. Then the nitrogen blanket is replaced by a dry air blanket and 383 parts hydroxyethyl acrylate (10% excess) are added at such a rate that the temperature of the reaction mixture does not exceed 75° C. The reaction mixture is stirred for an additional 1 hour at 90° C. Then 1 part p-methoxy phenol is added and the reaction mixture is allowed to cool to room temperature. The product, 1605 parts of unsaturated prepolymer in 780 parts of trimethylolpropane triacrylate and 35 parts of hydroxyethyl acrylate, is a clear, colorless, viscous oil. Analysis of the resulting material shows 0.06% isocyanate content.

EXAMPLE 4

522 parts 2.4-toluene diisocyanate, 780 parts trimethylolpropane triacrylate, and 0.5 part stannous octoate are placed in a vessel equipped with an agitator and blanketed with nitrogen. With stirring, 735 parts of poly (propylene oxide) triol (Dow Voranol CP700; Hydroxyl No. 229; 0.02% $H_2O$) are added at such a rate that the temperature of the reaction mixture does not rise above 50° C. The reaction mixture is kept at this temperature for an additional 1 hour. Then 191.4 parts allyl alcohol (10% excess) are added at such a rate that the temperature of the reaction mixture does not exceed 75° C. The reaction mixture is stirred for an additional 1 hour at 90° C. Then 1 part p-methoxy phenol is added and the reaction mixture is allowed to cool to room temperature. The product consists of 1413 parts unsaturated prepolymer in 780 parts trimethylolpropane triacrylate and 17.4 parts allyl alcohol. It is a clear, colorless, viscous oil. Analysis of the resulting material shows 0.03% isocyanate content.

EXAMPLE 5

188.6 parts isophoronediisocyanate, 292.3 parts trimethylol propane triacrylate, and 0.17 parts stannous octoate are placed in a vessel equipped with an agitator and blanketed with nitrogen. With stirring, 200.7 parts of poly (propylene oxide) triol (Dow Voranol CP700; hydroxyl No. 229; 0.02% $H_2O$) are added at such a rate that the temperature of the reaction mixture does not rise above 60° C. The reaction mixture is kept at this temperature for an additional 1 hour. Then the nitrogen blanket is replaced by a dry air blanket and 118.0 parts hydroxyethyl acrylate (10% excess) are added at such a rate that the temperature of the reaction mixture does not exceed 75° C. The reaction mixture is stirred for an additional 1 hour at 80° C. Then 1 part p-methoxy phenol is added and the reaction mixture is allowed to cool to room temperature. The product, 1605 parts of unsaturated prepolymer in 780 parts of trimethylolpropane triacrylate and 35 parts of hydroxyethyl acrylate, is a clear, colorless, viscous oil. Analysis of the resulting material shows 0.06% isocyanate content.

EXAMPLE 6

750 parts p,p'-diphenylmethane diisocyanate, 1000 parts toluene, and 0.5 part stannous octoate are placed in a vessel equipped with an agitator and blanketed with nitrogen. The mixture is stirred at room temperature and 258 parts poly (propylene oxide) triol (Voranol CP260; Hydroxyl No. 653; 0.02% $H_2O$) are added at such a rate that the temperature of the reaction mixture does not rise above 50° C. The reaction mixture is kept at this temperature for an additional 1 hour. Then the nitrogen blanket is replaced by a dry air blanket and 383 parts of hydroxyethyl acrylate (10% excess) are added at such a rate that the temperature of the reaction mixture does not exceed 75° C. After the addition is terminated, the temperature of the reaction mixture is raised to 90° C. for 1 hour. After adding 1.0 parts p-methoxy phenol, the reaction mixture is allowed to cool to room temperature and the solvent is removed under reduced pressure at or below 30° C. The product, 1398 parts, is a clear off-white resin. Analysis of the resulting material shows 0.01% isocyanate content.

EXAMPLE 7

1746 parts dimeryl diisocyanate, 500 parts dried toluene, and 1.0 part stannous octoate are placed in a vessel equipped with an agitator and blanketed with nitrogen. With stirring, 258 parts poly (propylene oxide) triol (Dow Voranol CP260; Hydroxyl No. 653; 0.02% $H_2O$) are added at such a rate that the temperature of the reaction mixture remains below 50° C. After the addition is completed, the reaction mixture is kept at 60° C. for 2 hours with stirring. Then 191.4 parts of allyl alcohol (10% excess) are added at such a rate that the temperature of the reaction mixture does not exceed 75° C. After the addition is completed the temperature is raised to 90° C. and the reaction mixture is kept stirring at this temperature for 2 hours. Then 1.0 part p-methoxy phenol is added, and the solvent is removed under reduced pressure. 2185 parts clear, colorless heavy oil is obtained as the product. Analysis of the resulting material shows 0.08% isocyanate content.

EXAMPLE 8

774 parts 4,4'-dicyclohexylmethane diisocyanate, 1000 parts trimethylolpropane triacrylate, and 0.5 part stannous oxtoate are placed in a vessel equipped with an agitator and blanketed with nitrogen. The mixture is stirred at room temperature and 735 parts of poly (propylene oxide) triol (Dow Voranol CP700; Hydroxyl No. 229; 0.02% $H_2O$) are added at such a rate that the temperature does not exceed 50° C. After the addition is completed, the reaction mixture is kept stirring at 50° C. for an additional 1 hour. Then the nitrogen blanket is replaced by a dry air blanket and 383 parts hydroxyethyl acrylate (10% excess) are added at such a rate that the temperature of the reaction mixture does not rise above 75° C. Following this step the reaction mixture is stirred for 2 hours at 90° C. Then 1.0 part p-methoxyphenol is added and the reaction mixture is allowed to cool to room temperature. The product, a clear, colorless, viscous oil, consists of a mixture of 1857 parts unsaturated prepolymer, 1000 parts trimethylolpropane triacrylate, and 35 parts hydroxyethyl acrylate. Analysis of the resulting material shows 0.06% isocyanate content.

EXAMPLE 9

348 parts 2,4-toluene diisocyanate, 500 parts dried toluene, and 0.5 part stannous octoate are placed in a vessel equipped with an agitator and blanketed with nitrogen. Then 407 parts poly (propylene oxide) diol (Dow Vornal P400; Hydroxyl No. 275; 0.02% $H_2O$) are added at such a rate that the temperature of the reaction mixture does not rise above 50° C. The reaction mixture is stirred at this temperature for an additional hour. Following this step, 286 parts hydroxyethyl methacrylate (10% excess) are added at such a rate that the temperature of the reaction mixture is raised to 90° C. and the stirring continued for an additional 1 hour. At the end of this period 1.0 part p-methoxy phenol is added and the solvent is removed under reduced pressure. A clear, colorless, viscous oil is obtained as the product. Analysis of the resulting material shows 0.02% isocyanate content.

EXAMPLE 10—UV Curable Overprint Varnish 100 parts of the product of Example 1, 235 parts trimethylolpropane triacrylate, 30 parts hydroxyethyl acrylate, 3 parts stearyl acrylate and 25 parts benzoin isobutyl ether are mixed well on a roller mill. A clear, colorless homogeneous light oil is obtained as the product.

Films of 0.4 mil thickness are applied with a wire wound coating rod onto paper, aluminum foil, vinyl coated aluminum foil, polyester coated mylar, and steel. The coated substrated are exposed for 1/10 second to the UV radiation given off by a medium pressure mercury vapor lamp (Hanovia 200 W/inch) at a distance of 5" from the lamp. This distance coincides with the second focal point created by the elliptical reflector.

After this exposure all samples are cured to hard, glossy coatings with a pencil hardness of at least 2H and a rub-resistance of at least 40 rubs, using methyl ethyl ketone as the solvent.

EXAMPLE 11—UV Curable Overprint Varnish 20 parts reaction product from Example 3, 8 parts trimethylolpropane triacrylate, 12 parts 1.4-butanediol diacrylate 10 parts acrylated epoxidized soybean oil (Union Carbide Co. Actomer X-70), 10 parts acrylic acid, 0.4 part stearyl acrylate and 2.75 parts benzoin isobutyl ether are mixed on a roller mill. A homogeneous, clear, colorless light oil is obtained. Films are applied and cured as shown in Example 10. The cured films have a pencil hardness of HB, are insoluble in solvents and rub resistant.

EXAMPLE 12—Electron Beam Curable Coating 30 parts of reaction product from Example 3, 20 parts trimethylolpropane triacrylate and 10 parts neopentyl glycol diacrylate are mixed on a roller mill. A clear, colorless heavy oil is obtained as the product. Steel and wood panels are coated with this composition with a 1 mil film knife. The coated test panels are exposed to 6 Mrad electron beam radiation under exclusion of air. After the irradiation, the coatings are clear, colorless, and glass-like. They have a pencil hardness of 4H, show excellent adhesion to metal and wood and are unaffected by solvent.

EXAMPLE 13—Electron Beam Curable Coating 20 parts reaction product from Example 3, 10 parts trimethlolpropane triacrylate, 10 parts reaction product from Example 9, 10 parts acrylated epoxidized soybean oil (Union Carbide Co. Actomer X-70), 10 parts neopentyl glycol diacrylate and 1 part stearyl acrylate are mixed on a roller mill until homogeneous. A clear, colorless, medium viscosity oil is obtained. Coatings of 4 mil thickness are applied with a film knife to asphalt tile, vinyl asbestos tile, vinyl tile and wood. The coated panels are exposed to 6 Mrad electron beam radiation under exclusion of air. After the irradiation, the coatings are tough, clear, colorless and very abrasion resistant.

EXAMPLE 14—UV Curable Ink 60 parts of reaction product from Example 3, 10 parts Lithol rubine pigment, 10 parts pentaerythritol tetraacrylate and 3 parts stearyl acrylate are mixed and ground on a three-roll mill until homogeneous. Then 5.4 parts benzoin isobutyl ether dissolved in 10 parts trimethylolpropane triacrylate are added and the milling is continued until the sensitizer is incorporated. The ink is applied to paper stock as a film of 0.1–0.4 mil thickness by means of a rubber roller. Complete cure of the ink is achieved by exposure to UV radiation for 0.5 second as described in Example 10.

Modified Polyamide Prepolymers

As previously mentioned, modified polyamide prepolymers prepared in accordance with the invention are also radiation curable and likewise useful for overprint varnishes, for protective films on panels and tiles and for abrasion and solvent resistant inks.

A preferred starting material for the preparation of these modified prepolymers is a polyamide polyamine, a material that is made by condensing an excess of polyamine with polycarboxylic acids, giving a still reactive condensation product. These are available in some variety, for example, under the trade names of Versamid and Emerez. Of course the modification in accordance with the invention could be made part of the original polyamide process, just as was above described in connection with the polyurethane process. It is convenient, however, to use these polyamide polyamine materials as starting materials. The materials are sometimes known as reactive polyamide resins and contain primary and secondary amine groups.

The above-described starting material is mixed with a smaller portion of an ethyl or methyl ester, or an anhydride, or an unsaturated dicarboxylic acid. The reaction mixture is stirred at a temperature such as 90° C. for a few hours and a slow stream of nitrogen is used to carry off the methanol or ethanol, which may be recovered by a cold trap. The reaction mixture is then stripped at low pressure (0.1 mm Hg), while stirring at 90° C. to remove unreacted ester and more methanol or ethanol. Finally, the product is allowed to cool in the presence of a small amount of p-methoxyphenol to inhibit premature polymerization. The ester that is recovered during low pressure stripping may be an isomerization product of the ester supplied to the reaction. Thus, dimethyl maleate may be rearranged into dimethyl fumarate, and dimethyl itaconate may be partly isomerized to the mesaconate and the citraconate.

The products of the reaction described are in some cases oils and in other cases resins. They are thereafter compounded on a roller mill with acrylic monomer esters, additives and then films are prepared and cured from the resulting mixture in substantially the same manner as already described in connection with the unsaturated polyether-polyurethane prepolymers. Further details regarding this aspect of the invention will be apparent from the following illustrative examples.

EXAMPLE 15

205 parts of a reactive polyamide resin (derived from the condensation of polymerized fatty acids with polyalkylamines and containing primary and secondary amine groups; General Mills Chemicals, Versamid 115, amine number 238) and 30 parts of dimethyl maleate are mixed in a vessel equipped with an agitator. The vessel is swept with a slow stream of nitrogen while the reaction mixture is stirred at 90° C. for 3 hours. During this time 3 parts of methanol (identified by gas chromatography) are recovered from the off-gas by means of a cold trap. In order to remove any unreacted dimethyl maleate, the reaction mixture is stripped at 0.1 mm Hg pressure while stirring at 90° C. During this time another 2 parts of methanol are recovered, but no unreacted dimethyl maleate. Then 0.1 part p-methoxyphenol is added and the product is allowed to cool to room temperature. 230.2 parts of a resinous, clear, but slightly yellowish oil are obtained. It is calculated that the ratio (dimethyl maleate reaction)/(amine) is equal to 0.25.

EXAMPLE 16

This preparation is carried out as described in Example 15. 100 parts Versamid 115 are reacted with 40 parts dimethyl maleate for 3 hours at 90° C. On stripping under reduced pressure approximately 17 parts of dimethyl fumarate and approximately 4 parts of methanol are recovered (both components are identified by gas chromatography). After adding 0.05 part p-methoxyphenol, the product is allowed to cool at room temperature. 117 parts of a greenish-yellow resin are obtained. It is calculated that the ratio (dimethyl maleate reacted)/(amine is equal to 0.35.

EXAMPLE 17

This preparation is carried out as described in Example 15. 99.1 parts Versamid 115 and 40 parts dimethyl maleate are reacted at 90° C. for 5 hours. Approximately 6 parts methanol are formed during this time. After adding 0.05 part p-methoxyphenol, the reaction mixture is stripped under reduced pressure. Approximately 13 parts of dimethyl fumarate are recovered. 124 parts of a greenish resin are obtained. It is calculated that the ratio (dimethyl maleate reacted)/(amine) is equal to 0.52.

EXAMPLE 18

100 parts reactive polyamide resin (General Mills Chemicals, Versamid 100, amine number 90) and 30 parts diethyl maleate are reacted for 5 hours as described in Example 15. During this time 5 parts ethanol are formed. Then 0.05 part p-methoxyphenol is added. On stripping under reduced pressure an additional small amount of ethanol and 6 parts diethyl fumarate are recovered. 116 parts product are obtained as a residue. The product is a clear, yellowish resin. It is calculated that the ratio (diethyl maleate reacted)/(amine) is equal to 0.80.

EXAMPLE 19

100 parts reactive polyamide resin (Emery Industries, Emerez 1515; amine number 345) and 50 parts dimethyl maleate are reacted for 4 hours at 90° C. as described in Example 15. During this time 8 parts methanol are recovered from the off-gas in a cold trap. On stripping under reduced pressure 5 parts unreacted dimethyl fumarate are recovered. Then 0.05 part p-methoxyphenol is added and the product is taken as a residue. 135 parts clear, yellow resin are obtained. It is calculated that the ratio (dimethyl maleate reacted)/(amine) is equal to 0.51.

EXAMPLE 20

100 parts reactive polyamide resin (General Mills Chemicals, Versamid 115, amine number 238) and 30 parts 5-norbornene-2,3-dicarboxylic anhydride are mixed in a vessel equipped with an agitator and blanketed with nitrogen. The reaction mixture is stirred at 90° C. for 3 hours. Then the reaction mixture is stripped at 90° C. under reduced pressure (0.1 mm Hg). No unreacted 5-norbornene-2,3-dicarboxylic anhydride is recovered. 0.05 part p-methoxyphenol is added, and the product is taken as a residue. A glass-like, yellowish solid, soluble in tetrahydrofuran, methylene chloride, etc. is obtained. It is calculated that the ratio (5-norbornene-2,3-cicarboxylic acid reacted)/(amine) is equal to 0.43.

EXAMPLE 21

100 parts reactive polyamide resin (General Mills Chemicals, Versamid 115, amine number 238) and 15 parts dimethyl maleate are reacted for 3 hours as described in Example 15. After stripping at 90° C. and 0.1 mm Hg pressure, 20 parts of 5-norbornene-2,3-dicarboxylic anhydride are added. The reaction mixture is stirred at 90° C. under a nitrogen blanket for another 3 hours. Then 0.05 part p-methoxyphenol is added and the reaction mixture is allowed to cool to room temperature. An extremely viscous resin is obtained. It is calculated that 24.5% of the amine groups are reacted with dimethyl maleate and 28.7% with 5-norbornene-2,3-dicarboxylic anhydride.

EXAMPLE 22

100 parts Versamid 115 are reacted with 45 parts dimethyl itaconate for 3 hours at 90° C. as described in Example 15. Then the reaction mixture is stripped at 0.1 mm Hg pressure. Approximately 3 parts of methanol and 20 parts of a mixture of diemthyl mesaconate, dimethyl itaconate and dimethyl citraconate (identified by gas chromatography) are removed from the reaction mixture. 0.05 parts p-methoxyphenol is added and the product is taken as a residue. 120 parts clear, yellowish viscous oil are obtained.

EXAMPLE 23—UV Curable Overprint Varnish 100 parts of the product of Example 15, 135 parts trimethylolpropane triacrylate, 30 parts hydroxyethyl acrylate, 2 parts paraffin wax (Esso wax 3150; m.p. 135° C.), and 10 parts benzoin isobutyl ether are mixed well on a roller mill. A clear, almost colorless, medium oil is obtained.

Films of 0.4 mil thickness are applied with a wire wound coating rod onto paper, aluminum foil, vinyl coated aluminum foil, polyester coated mylar, and steel. The coated substrates are exposed for 1/10 second to the UV radiation given off by a medium pressure mercury vapor lamp (Hanovia, 200 W/inch) at a distance of 5" from the lamp. This distance coincides with the second focal point created by the elliptical reflector.

After this exposure, all the coatings are cured. They have a pencil hardness of at least 3H and rub resistance of at least 40 rubs using methyl ethyl ketone as the solvent.

EXAMPLE 24—Electron Beam Curable Coating 20 parts of reaction product from Example 16, 20 parts trimethylolpropane triacrylate, and 20 parts neopentyl glycol diacrylate are mixed on a roller mill. A clear, slightly yellowish medium oil is obtained. Steel, wood aluminum and plastic panels are coated with this formulation using a 1 mil film knife. The coated test panels are exposed to 6 Mrad electron beam radiation under exclusion of air. After the irradiation, the coatings are clear, colorless, hard and glasslike. They have a pencil hardness of 4H, show excellent adhesion and are unaffected by solvents.

The same type of coatings are cured in presence of air by exposing them to 20 Mrad electron beam radiation.

EXAMPLE 25—Electron Beam Curable Coating 20 parts product from Example 22, 10 parts trimethylolpropane triacrylate, 10 parts 1,6-hexane-diol diacrylate, 10 parts acrylated epoxidized soybean oil (Union Carbide Co., Actomer X-70), and 1 part stearyl acrylate are milled on a roller mill until homogeneous. A clear, almost colorless, medium viscosity oil is obtained. Coatings of 4 mil thickness are applied with a film knife to asphalt tile, vinyl tile and wood. The coated substrates are exposed to 5 Mrad electron beam radiation under exclusion of air. After the exposure the coatings are tough, clear colorless, not affected by solvents, and are very abrasion resistant.

EXAMPLE 26—UV Curable Ink 50 parts of reaction product from Example 16, 20 parts trimethylolpropane triacrylate, 10 parts Lithol rubine pigment, and 3 parts stearyl acrylate are mixed and ground on a three-roll mill until homogeneous. Then 5.5 parts benzoin isobutyl ether, dissolved in 10 parts trimethylolpropane triacrylate are added and the milling is continued for a short time. The ink is applied to paper stock as a film of 0.1–0.4 mil thickness by means of a rubber roller. Complete cure of the ink is achieved by exposure to UV radiation for 0.5 seconds as described in Example 9.

The radiation curable coatings of this invention are extremely useful for making hard coatings without the application of extensive heat to the coated surface, and without the necessity of depositing an already cured resin from a solvent which must then be evaporated and recovered. The modified prepolymers of the present invention make it possible to prepare hard coatings by spreading a prepolymer material of convenient fluidity and then quickly curing the film to make it resistant to abrasion and to solvents.

Release Coatings

EXAMPLE 27

10 parts dimethyl maleate-modified reactive polyamide resin (versamid 115—General Mills Chemicals—reacted with 40% by weight of dimethyl maleate at 90° C . for 3 hours, excess dimethyl maleate removed under reduced pressure) are mixed with 10 parts pentaerythritol tetraacrylate, 0.01 part phenothiazine, 0.4 part Esso wax 3150 (paraffin wax, m.p. approx. 132° C.), 0.8 part benzoin isobutyl ether and 20 parts methylene chloride. A clear, low viscosity oil is obtained.

A carrier paper made of smooth clay coated sheet weighing about 16 pounds per ream (500 sheets, 20×25 inches) is coated with the above solution using a #20 Mayer rod. The coated paper then is exposed for 1/10 second to the UV radiation given off by a medium pressure mercury vapor lamp (Hanovia, 200 W/inch) at a distance of 5 inches from the lamp. This distance coincides with the second focal point created by the elliptical reflector. By this exposure, the coating is cured to a hard, glossy film which has a pencil hardness of 3H.

The radiation cured release coating is then print coated with a clear lacquer composed of 6 parts cellulose acetate-burytate (Eastman EAB 171-40), 55 parts ethylacetate, 28 parts toluene, and 11 parts 95% ethanol (Printing grade). Print coating is accomplished using a regular varnish etch cylinder having a depth of about 20 to 40 microns, 120 line screen and a 15–20 wall (equivalent to #8 Mayer rod). The applied lacquer coating is dried at 140° F. for 1 minute.

The design print is then printed over the clar lacquer layer using polyamide-nitrocellulose modified ink containing pigment or dye of the color desired (ZYROTO WHITE, sold by Gotham Ink and Color Co., which contains a titanium dioxide pigment). The area of the design print is smaller than that of the printed lacquer layer and falls wholly within the margin of the lacquer layer.

Over the ink, as an overprint, there is then coated a clear adhesive layer comprising a solution of heat-activatable thermoplastic polyamide resin in lacquer form (VERSAMIDE 940, sold by General Mills) followed by drying the adhesive to a dry non-tacky state. The area of the adhesive overprint is smaller than that of the lacquer and it falls wholly within the margins of the lacquer layer.

There is no pick-up during the three printing operations.

The heat transfer label, as formed above, is then put in contact with a polyethylene bottle, the surface of which has been treated to render it more print receptive in a conventional manner such as by flame contact. Heat and pressure are applied to the temporary backing to effect pressing of the adhesive layer against the polyethylene surfaces. As heat is applied, approximately 350° F., there is no softening of the release layer or the cellulose acetate layer, but the adhesive overprint is heat-activated to a highly tacky state and bonds to the polyethylene surface of the bottle. The temporary backing may then be stripped from the transfer label or may be left on the transfer and stripped at a subsequent time without danger of delaminating the transfer from the polyethylene surface. No portion of the release layer is left over the transfer after stripping of the temporary backing and no portion of the lacquer is removed with the release layer. After cooling and peeling of the temporary backing, the bottle so coated is flame treated and the adherence of the label thereto is determined. Adherence was excellent.

EXAMPLE 28

Same as Example 27, except that 1.0 part of cyclododecane is used in place of the Esso Wax 3150.

EXAMPLE 29

Same as Example 27, except that 1.0 part stearic acid is used in place of Esso Wax 3150.

EXAMPLE 30

Same as Example 27, except that 1.4 parts-methanacryl oxypropyl trimethoxy silane (Union Carbide silane A-174) are used in place of the Esso Wax 3150.

EXAMPLE 31

Same as Example 27, except that 0.6 part E-wax (Farbwerke Hoechst AB, Montan type wax) is used in place of the Esso Wax 3150.

EXAMPLE 32

Same as Example 27, except that 1.0 part FL-wax (Farbwerke Hoechst AB, Montan type wax) is used in place of the Esso wax 3150.

EXAMPLE 33

Same as Example 27, except that 1.4 parts F-wax (Farbwerke Hoechst AB, Montan type wax) are used in place of the Esso wax 3150.

EXAMPLE 34

Same as Example 27, except that 0.5 part octadecanol is used in place of the Esso wax 3150.

EXAMPLE 35

Same as Example 27, except that 1.0 part oleamide (Armour Industrial Chemical Co., Armid O) is used in place of the Esso wax 3150.

EXAMPLE 36

Same as Example 27, except that 1.4 parts stearyl acrylate are used in place of the Esso wax 3150.

EXAMPLE 37

Same as Example 27, except that 0.6 part isodecyl acrylate is used in place of the Esso wax 3150.

EXAMPLE 38

Same as Example 27, except that 1.0 part fluorolube LG-160 (Hooker Chemical Co.) is used in place of the Esso wax 3150.

EXAMPLE 39

Same as Example 27, except that 1.4 part halocarbon wax (Halocarbon Products Corp.) is used in place of the Esso wax 3150.

EXAMPLE 40

Same as Example 27, except that 1.0 part silicone S-30 (Union Carbide Co.) is used in place of the Esso wax 3150.

EXAMPLE 41

Same as Example 27, except that 1.0 part silicone L-31 (Union Carbide Co.) is used in place of the Esso wax 3150.

EXAMPLE 42

Same as Example 27, except that 0.5 part Syl-Off 291 (Dow Corning Co.) is used in place of the Esso wax 3150.

EXAMPLE 43

Same as Example 27, except that 1.0 part Syl-Off 291 containing 6% Catalyst 23A (Dow Corning Co.) is used in place of the Esso wax 3150.

EXAMPLE 44

Same as Example 27, except that 1.0 part V-wax (Farbwerke Hoechst AG, poly (octadecyl viny ether) is used in place of the Esso wax 3150.

EXAMPLE 45

Same as Example 27, except that 1.4 parts W-wax (Farbwerke Hoechst AG, hydrogenated animal fat) is used in place of the Esso wax 3150.

EXAMPLE 46

22.6 parts unsaturated polyurethane prepared from 1 mole polyether triol, 3 moles 2,4-toluene diisocyanate, and 3 moles 2-hydroxyethyl acrylate, 20.4 parts 2-hydroxyethyl acrylate, 20.15 parts pentaerythritol tetraacrylate, 18.38 parts 1,6-hexanediol diacrylate, 12.44 parts trimethylolpropane triacrylate, 6.03 parts acrylated epoxidized soybean oil (Union Carbide Co., Actomer X-70), 6.0 parts benzoin isobuty ether, 2.0 parts Esso wax 3150 (paraffin wax, melting point approx. 132° C.) and 30 parts methylene chloride are mixed well until a homogeneous solution is obtained.

A carrier paper made of smooth clay coated sheet weighing about 16 pounds per ream (500 sheets, 10 inches×25 inches) is coated with the above solution (using a #20 Mayer rod). The coated paper then is exposed for 1/10 second to the UV-radiation given off by a medium pressure mercury vapor lamp (Hanovia, 200 2/inch) at a distance of 5 inches from the lamp. The distance coincides with the second focal point created by the elliptical reflector. By this exposure, the coating is cured to a hard, glossy film which has a pencil hardness of 3H.

The radiation cured release coating is then print coated with a clear lacquer composed of 6 parts cellulose acetatebutyrate (Eastman EAB 171-40), 55 parts ethylacetate, 28 parts toluene and 11 parts 95% ethanol (printing grade). Print coating is accomplished using a regular varnish etch cylinder having a depth of about 20 to 40 microns, 120 line screen and a 15–20 wall (equivalent to #8 Mayer rod). The applied lacquer coating is dried at 140° F. for 1 minute.

The design printing is then printed over the clear lacquer layer using polyamide-nitrocellulose modified ink containing pigment or dye of the color desired (ZYROTO WHITE, sold by Gotham Ink and Color Co., which contains a titanium dioxide pigment). The area of the design print is smaller than that of the printed lacquer layer and falls wholly within the margin of the lacquer layer.

Over the ink, as an overprint, there is then coated a clear adhesive layer comprising a solution of a heat-activatable thermoplastic polyamide resin in lacquer form (VERSAMIDE 940, sold by General Mills) followed by drying the adhesive to a dry non-tacky state. The area of the adhesive overprint is smaller than that of the lacquer and it falls wholly within the margins of the lacquer layer.

There is no pick-up during the three printing operations.

The heat transfer label, as formed above, is then put in contact with a polyethylene bottle, the surface of which has been treated to render it more print receptive in a conventional manner such as by flame contact. Heat and pressure are applied to the temporary backing to effect pressing of the adhesive layer against the polyethylene surfaces. As heat is applied, approximately 350° F., there is no softening of the release layer or the cellulose acetate layer, but the adhesive overprint is heat-activated to a highly tacky state and bonds to the polyethylene surface of the bottle. The temporary backing may then be stripped from the transfer label or may be left on the transfer and stripped at a subsequent time without danger of delaminating the transfer from the polyethylene surface. No portion of the release layer is left over the transfer after stripping of the temporary backing and no portion of the lacquer is removed from the release layer. After cooling and peeling of the temporary backing, the bottle so coated is flame treated and the adherence of the lable thereto is determined. Adherence was excellent.

EXAMPLE 47

Same as Example 46, except that 3.0 parts of cyclododecane are used in place of the Esso wax 3150.

EXAMPLE 48

Same as Example 46, except that 2.0 parts stearic acid are used in place of Esso wax 3150.

EXAMPLE 49

Same as Example 46, except that 2.4 parts methacryl oxypropyl trimethoxy silane (Union Carbide silane A-174) are used in place of the Esso wax 3150.

EXAMPLE 50

Same as Example 46, except that 3.0 parts E-wax (Farbwerke Hoechst AG, Montan type wax) are used in place of the Esso wax 3150.

EXAMPLE 51

Same as Example 46, except that 2.0 parts FL-wax (Farbwerke Hoechst AG, Montan type wax) are used in place of the Esso wax 3150.

EXAMPLE 52

Same as Example 46, except that 2.4 parts F-wax (Farbwerke Hoechst AG, Montan type wax) are used in place of the Esso wax 3150.

EXAMPLE 53

Same as Example 46, except that 3.0 parts octadecanol are used in place of the Esso wax 3150.

EXAMPLE 54

Same as Example 46, except that 4.0 parts oleamide (Amour Industrial Chemical Co., Armid O) are used in place of the Esso Wax 3150.

EXAMPLE 55

Same as Example 46, except that 3.0 parts stearyl acrylate are used in place of the Esso wax 3150.

EXAMPLE 56

Same as Example 46, except that 2.5 parts isodecyl acrylate are used in place of the Esso wax 3150.

EXAMPLE 57

Same as Example 46, except that 3.0 parts fluorolube LG-160 (Hooker Chemicals Co.) are used in place of the Esso wax 3150.

EXAMPLE 58

Same as Example 46, except that 3.0 parts halocarbon wax (Halocarbon Products Corp.) are used in place of the Esso wax 3150.

EXAMPLE 59

Same as Example 46, except that 4.0 parts silicone S-30 (Union Carbide Co.) are used in place of the Esso wax 3150.

EXAMPLE 60

Same as Example 46, except that 4.0 parts silicone L-31 (Union Carbide Co.) are used in place of the Esso wax 3150.

EXAMPLE 61

Same as Example 46, except that 2.0 parts Syl-Off 291 (Dow Corning Co.) are used in place of the Esso wax 3150.

EXAMPLE 62

Same as Example 46, except that 4.0 parts Syl-Off 291 containing 6% Catalyst 23A (Dow Corning Co.) are used in place of the Esso wax 3150.

EXAMPLE 63

Same as Example 46, except that 3.0 parts V-wax (Farbwerke Hoechst AG, poly (octadecyl vinyl ether)) are used in place of the Esso wax 3150.

EXAMPLE 64

Same as Example 46 except that 2.4 parts W-wax (Farbwerke Hoechst AG, hydrogenated animal fat) are used in place of the Esso wax 3150.

EXAMPLE 65

66.3 parts unsaturated polyurethane, prepared from 1 mole polyether triol (Voranol CP700), 3 moles 2,4-toluene diisocyanate, and 3 moles 2-hydroxyethyl acrylate, 72.3 parts trimethylolpropane triacrylate, 1.5 parts 2-hydroxyethyl acrylate, 68 parts 1,4-butanediol diacrylate, 50 parts acrylated epoxidized soybean oil (Union Carbide Co., Actomer X-70), 2 parts stearyl acrylate, 15.6 parts benzoin isobutyl ether and 5.0 parts Union Carbide Co. silicone rubber W-982 (polydimethyl siloxane with some unsaturation) are mixed well on a roller mill. A clear, colorless homogeneous light oil is obtained as the product.

Films of 0.2-1 mil thickness are applied with wire wound coating rods onto paper. The coated paper is exposed to the UV-radiation given off by a medium pressure mercury vapor lamp (Hanovia, 200 W/inch) at a distance of 5 inches from the lamp (second focal point created by the elliptical reflector). After this exposure the films are cured to hard, glossy coatings.

9 lbs./ream removable adhesive is cast on a paper substrate; then the coated paper is laminated to the release paper. The force to peel a 1 inch wide strip at 12 inches/min. is 43 g./linear inch.

EXAMPLE 66

66.3 parts unsaturated polyurethane, prepared from 1 mole polyether triol (Voranol CP700), 3 moles 2,4-toluene diisocyanate and 3 moles 2-hydroxyethyl acrylate, 72.3 parts trimthylolpropane triacrylate, 15. parts 2-hydroxyethyl acrylate, 68 parts 1,4-butanediol diacrylate, 50 parts acrylated epxidized soybean oil (Union Carbide Co., Actomer X-70), 2 parts stearyl acrylate, 15.6 parts benzoin isobutyl ether and 10.0 parts Viscasil 60000 (General Electric; poly (dimethylsiloxane) viscosity 60'000 ctsk) are mixed well on a roller mill. A clear colorless homogeneous light oil is obtained as the product.

Films of 0.2–1 mil thickness are applied with wire wound coating rods onto paper. The coated paper is exposed to the UV-radiation given off by a medium pressure mercury vapor lamp (Hanovia, 200 W/inch) at a distance of 5 inches from the lamp (second focal point created by the elliptical reflector). After this exposure the films are cured to hard, glossy coatings.

9 lbs./ream removable adhesive is cast on a paper substrate; then the coated paper is laminated to the release paper. The force to peel a 1 inch wide strip at 12 inches/min. is 55 g./linear inch.

EXAMPLE 67

66.3 parts unsaturated polyurethane, prepared from 1 mole polyether triol (Voranol CP700), 3 moles 2,4-toluene diisocyanate, and 3 moles 2-hydroxyethyl acrylate, 72.3 parts trimethylolpropane triacrylate, 1.5 parts 2-hydroxyethyl acrylate, 68 parts 1,4-butanediol diacrylate, 50 parts acrylated epoxidized soybean oil (Union Carbide Co., Actomer X-70), 2 parts stearyl acrylate, 15.6 parts benzoin isobutyl ether and 6.43 parts silicone L-31 (Union Carbide Co.; poly (methyl hydrogen siloxane) are mixed well on a roller mill. A clear, colorless light oil is obtained as the product.

Films of 0.2–1 mil thickness are applied with wire wound coating rods onto paper. The coated paper is exposed to the UV-radiation given off by a medium pressure mercury vapor lamp (Hanovia, 200 W/inch) at a distance of 5 inches from the lamp (second focal point created by the elliptical reflector). After this exposure the films are cured to hard, glossy coatings.

9 lbs./ream removable adhesive is cast on a paper substrate; then the coated paper is laminated to the release paper. The force to peel a 1 inch wide strip at 12 inches/min. is 80 g./linear inch.

EXAMPLE 68

66.3 parts unsaturated polyurethane, prepared from 1 mole polyether triol (Voranol CP700), 3 moles 2,4-toluene diisocyanate, and 3 moles 2-hydroxyethyl acrylate, 72.3 parts trimethylolpropane triacrylate, 1.5 parts 2-hydroxyethyl acrylate, 68 parts 1,4-butanediol diacrylate, 50 parts acrylated epoxidized soybean oil (Union Carbide Co., Actomer X-70), 2 parts stearyl acrylate, 15.6 parts benzoin isobutyl ether and 2.65 parts silicone L-522 (Union Carbide Co., poly dimethyl siloxane with some hydroxyethyl groups) are mixed well on a roller mill. A clear, homogeneous light oil is obtained as the product.

Films of 0.2–1 mil thickness are applied with wire wound coating rods onto paper. The coated paper is exposed to the UV-radiation given off by a medium pressure mercury vapor lamp (Hanovia, 200 W/inch) at a distance of 5 inches from the lamp (second focal point created by the elliptical reflector). After this exposure the films are cured to hard, glossy coatings.

9 lbs./ream removable adhesive is cast on a paper substrate; then the coated paper is laminated to the release paper. The force to peel a 1 inch wide strip at 12 inches/min. is 30 g./linear inch.

The release coatings of this invention can also be made by radiation curing of a wax-containing acrylic prepolymer. This is illustrated by the next example.

EXAMPLE 69

75 parts trimethlolpropane triacrylate, 25 parts neopentyl glycol diacrylate, 5 parts halocarbon wax (Halocarbon Products Corp., blend of completely halogenated chlorofluorocarbons) and 10 parts benzoin isobutyl ether are milled on a 3 roller mill until homogeneous. A clear solution is obtained.

Films of 0.2–1 mil thickness are applied with a wire wound coating rod onto paper. The coated paper is exposed to the UV-radiation given off by a medium pressure mercury vapor lamp (Hanovia, 200 W/inch) at a distance of 5 inches from the lamp (second focal point created by the elliptical reflector). After this exposure the films are cured to hard, glossy coatings.

9 lbs./ream removable adhesive is cast on a paper substrate; then the coated paper is laminated to the release paper. The force to peel a 1 inch wide strip at 12 inches/min is 31 gr./linear inch.

Example 69 illustrates that the new class of radiation curable release type coatings according to the invention may be made without any polyurethane or polyamide component in the unsaturated resin. A polyurethane or polyamide content in the radiation curable unsaturated prepolymer is, however, a practical necessity for a satisfactory ink, overprint varnish or panel or tile coating.

Examples 70 and 71 illustrate further polyurethane prepolymers.

EXAMPLE 70

864 parts of a tetra isocyanate (Desmodur HL TDI isocyanurate; prepared from 4 moles of 2,4-toluene diisocyanate and 1 mole hexamethylene diisocyanate; MW 864; isocyanate equivalent 216), 1000 parts dried tetrahydrofuran, and 1.0 part stannous octoate are placed in a vessel equipped with an agitator and blanketed with nitrogen. Then 1628 parts poly (propylene oxide) diol (Dow Voranol P400; hydroxyl No. 275; 0.02% H$_2$O) are added at such a rate that the temperature of the reaction mixture does not rise above 50° C. The reaction mixture is stirred at this temperature for an additional one hour. Following this step, 510 parts 2-hydroxyethyl acrylate (10% excess) are added at such a rate that the reaction mixture starts to reflux gently. The stirring is continued at reflux for an additional one hour. At the end of this period 2.0 parts p-methoxyphenol is added and the solvent is removed under reduced pressure. A clear, colorless, viscous oil is obtained as the product.

EXAMPLE 71

348 parts 2.4-toluene diisocyanate, 500 parts dried tetrahydrofuran and 0.5 part stannous octoate are placed in a vessel equipped with an agitator and blanketed with nitrogen. Then 400 parts poly (ethylene oxide) diol (hydroxyl No. 280) dissolved in 200 parts dried tetrahydrofuan are added at such a rate that the temperature of the reaction mixture does not rise above 50° C. The reaction mixture is stirred at this temperature for an additional one hour. Following this step, 286 parts hydroxethyl methacrylate (10% excess) are added at such a rate that the reaction mixture begins to reflux. Then the stirring is continued at reflux for an additional one hour. At the end of this period 1.0 part p-methoxy phenol is added and the solvent is removed under reduced pressure. A clear, colorless, viscous oil is obtained as the product.

EXAMPLE 72

20.27 parts unsaturated polyurethane prepared from 1 mol polyether triol, 3 moles 2,4-toluene diisocyanate, and 3 moles 2-hydroxyethyl acrylate, 11.16 parts trimethylolpropane triacrylate, 7.39 parts neopentylglycol diacrylate, 6.16 parts 1,6-hexanediol diacrylate, 17.45 parts 2-hydroxyethyl acrylate, 5.34 parts acrylated epoxidized soybean oil (Union Carbide Co., Actomer X-70), 7.39 parts benzoin isobutyl ether, 4.72 parts silicone oil (Dow Corning, PA-11), and 2.67 parts fluorochlorocarbon oil (Halocarbon Products Corp., Halocarbon oil 0.8/100) are mixed well until a homogeneous solution is obtained.

A carrier paper made of a smooth clay coated sheet weighing 16 pounds per ream is coated with the above solution. The coated paper is then exposed for 1/10 second to the UV-radiation given off by a medium pressure mercury vapor lamp (Hanovia 200 W/inch) at a distance of five inches from the lamp. This exposure cures the coating to a hard, glossy film.

The radiation cured release coating is then processed further as set forth in Example 46.

Other waxy materials which can be used in formulations similar to Example 72 in substitution for the silicone oil and fluorocarbon oil of that Example are given in Examples 73-85 below.

EXAMPLE 73

4.72 parts silicone oil (Dow Corning, PA-11)
2.67 parts Fluorochlorocarbon oil (Halocarbon Products Corp., Halocarbon oil 437)

EXAMPLE 74

1.4 parts ester wax (Hoechst, E-Wax)
1.4 parts Fluorochlorocarbon oil (Halocarbon Products Corp., Halocarbon oil 0.8/100)

EXAMPLE 75

1.4 parts cyclododecane, dissolved in 4.2 parts methyle chloride (MC)
1.4 parts Halocarbon oil 0.8/100

EXAMPLE 76

1.4 parts cyclododecane dissolved in 4 parts MC
1.4 parts Halocarbon oil 437

EXAMPLE 77

0.94 parts cyclododecane dissolved in 3 parts MC
4.7 parts dimethyldiphenyl polysiloxane (General Electric Co., SF-1153 Silicone)

EXAMPLE 78

0.94 parts cyclododecane, dissolved in 3 parts MC
4.7 parts vinyl triethoxy silane (Union Carbide Corp., Silane A-151)

EXAMPLE 79

0.94 parts cyclododecane, dissolved in 3 parts MC
4.70 parts silicone oil (Union Carbon, Silicoen Y-2902)

EXAMPLE 80

0.94 parts cyclododecane, dissolved in 3 parts MC
4.70 parts non-ionic organosilicone fluid (Union Carbide, Silicone L-49)

EXAMPLE 81

0.94 parts cyclododecane, dissolved in 3 parts MC
4.70 parts non-ionic organosilicone fluid (Union Carbide, Silicone L-7001)

EXAMPLE 82

0.94 parts cyclododecane, dissolved in 3 parts MC
4.70 parts N-beta (aminoethyl)-gamma aminopropyltrimethoxy silane (Union Carbide, Silane A-1120)

EXAMPLE 83

0.94 parts cyclododecane, dissolved in 3 parts MC
4.70 parts non-ionic organosilane fluid (Union Carbide, Silicone L-522)

EXAMPLE 84

2.29 parts fluorochlorocarbon wax (Halocarbon Products Corp., Halocarbon wax 6.000), dissolved in 9.3 parts tetrahydrofurane

EXAMPLE 85

0.93 parts dimethyl polysiloxane oil (Union Carbide, Silicone L-522)
2.78 parts fluorochlorocarbon oil (Halocarbon Products Corp., Halocarbon oil 437)

Examples 86, 87, 91, 92 and 93 illustrate radiation curable release coating prepared from acrylated epoxy resins dispersed in acrylate monomers. Examples 88, 89 and 90 illustrate release coatings prepared from unsaturated polyester resins dispersed in acrylate monomers. Example 95 is a release coating formulation of acrylate monomers without prepolymer. Examples 96 and 97 illustrate release coatings prepared from epoxide resins polymerizable by release of catalyst on exposure to ionizing radiation. Examples 98, 99 and 100 depict release coatings based on a radiation curable polyene-polythiol system. Examples 101, 102 and 103 illustrate release coatings prepared from polyunsaturated urethanes in acrylate esters, while Example 104 illustrates another release coating prepared from acrylic esters.

EXAMPLE 86

33.06 parts Epoxryl 25-A-60 (Shell Chem. Co., 60% dimethacrylate ester of bis glycidyl ether of Bisphenol A in acetone solvent), 33.06 parts trimethylolpropane triacrylate, 14 parts pentaerythritol tetraacrylate, 14 parts neopentylglycol diacrylate, 33.46 parts 1,6-hexanediol diacrylate, 14 parts 2-hydroxyethyl acrylate, 8.26 parts acrylated epoxidized soybean oil (Union Carbide Co., Actomer X-70), 9.91 parts benzoin isobutyl ether, and 2,64 parts gamma-methacryloxy propyltrimethoxysilane (Union Carbide Co., Silane A-174) are mixed well until a homogeneous solution is obtained.

The resulting solution is then processed further as set forth in Example 72.

EXAMPLE 87

20.00 parts Epocryl DRH-303 (Shell Chem. Co., diacrylate ester of liquid bisphenol A resin), 20.00 parts trimethylolpropane triacrylate, 13.00 parts pentaerythritol tetraacrylate, 15.21 parts neopentylglycol diacrylate, 18.25 parts 1,6-hexanediol diacrylate, 14 parts 2-hydroxyethyl acrylate, 8.50 parts acrylated epoxidized soybean oil (Union Carbide Co., Actomer X-70), 10.20 parts benzoin isobutyl ether, 1.10 part cyclododecane, dissolved in 3.5 parts methylene chloride, and 5.00 parts N-beta-aminoethyl-gamma-aminopropyltrimethoxysilane (Union Carbide Co., Silane A-1120) are mixed well until a homogeneous solution is obtained.

The resulting solution is then processed further as set forth in Example 72.

EXAMPLE 88

20.10 parts unsaturated polyester, made from adipic acid, maleic anhydride, and hexanediol; molecular weight approx. 3000, 4 double bonds per polyester; 20.00 parts trimethylolpropane triacrylate, 20 parts pentacrylthritol tetraacrylate, 20.00 parts neopentylglycol diacrylate, 20.00 parts 1,6-hexanediol diacrylate, 5.10 parts 2-hydroxyethyl acrylate, 5.50 parts acrylated epoxidized soybean oil (Union Carbide Co., Actomer X-70) 10.00 parts benzoin isobutyl ether, 1.50 parts cyclododecane, dissolved in 4.5 parts methylene chloride, and 1.50 parts fluorochlorocarbon oil (Halocarbon Products Corp., Halocarbon oil 437) are mixed well until a homogeneous solution is obtained.

The resulting solution is then processed further as set forth in Example 72.

EXAMPLE 89

20.00 parts unsaturated polyester, made from adipic acid, maleic anhydride, and hexanediol; molecular weight approx. 3000; 4 double bonds per polyester; 20.00 parts trimethylolpropane triacrylate, 15 parts pentaerythritol tetraacrylate, 20.00 parts neopentylglycol diacrylate, 20.00 parts 1,6-hexanediol diacrylate 6.00 parts 2-hydroxyl acrylate, 5.00 parts acrylated epoxidized soybean oil (Union Carbide Co., Actomer X-70), 9.00 parts benzoin isobutyl ether, 1.20 parts cyclododecane, dissolved in 3.6 parts methylene chloride, and 5.00 parts N-beta-animoethylgamma-aminopropyltrimethoxysilane (Union Carbide, Co., Silane A-1120) are mixed well until a homogeneous solution is obtained.

The resulting solution is then processed further as set forth in Example 72.

EXAMPLE 90

20.00 parts unsaturated polyester, made from adipic acid, maleic anhydride, and hexanediol; molecular weight approx. 3000; 4 double bonds per polyester, 20.00 parts trimethylolpropane triacrylate, 20 parts pentaerythritol tetraacrylate, 20.00 parts neopentylglycol diacrylate, 20.00 parts 1,6-hexanediol diacrylate, 5.00 parts 2-hydroxyethyl acrylate, 7.00 parts acrylated epoxidized soybean oil (Union Carbide Co., Actomer X-70), 10.00 parts benzoin isobutyl ether, 1.20 parts cyclododecane, dissolved in 3.6 parts methylene chloride, and 5.00 parts dimethyl diphenyl polysiloxane (General Electric Co., Silicone SF-1153) are mixed well until a homogeneous solution is obtained.

The resulting solution is then processed further as set forth in Example 72.

EXAMPLE 91

20.00 parts Epocryl DRH-303 (Shell Chem. Co., diacrylate ester of liquid bisphenol A resin), 20.00 parts trimethylolpropane triacrylate, 12.00 parts pentaerythritol tetraacrylate, 20.00 parts neopentylglycol diacrylate, 15.00 parts 1,6-hexanediol diacrylate, 5.00 parts 2-hydroxyethyl acrylate, 6.00 parts acrylated epoxidized soybean oil (Union Carbide Co., Actomer X-70), 10.00 parts benzoin isobutyl ether, 1.50 parts cyclododecane dissolved in 4.5 parts methylene chloride, and 1.50 parts fluorochlorocarbon oil (halocarbon Products Corp., Halocarbon oil 437) are mixed well until a homogeneous solution is obtained.

The resulting solution is then processed further as set forth in Example 72.

EXAMPLE 92

20.00 parts Epocryl DRH-303 (Shell Chem. Co., diacrylate ester of liquid bisphenol A resin), 20.00 parts trimethylolpropane triacrylate, 12.00 parts pentaerythritol tetraacrylate, 20.00 parts neopentylglycol diacrylate, 15.00 parts 1,6-hexanediol diacrylate, 5.00 parts 2-hydroxyethyl acrylate, 6.00 parts acrylated epoxidized soybean oil (Union Carbide Co., Actomer X-70), 10.00 parts benzoin isobutyl ether, 1.20 parts cyclododecane, dissolved in 3.6 parts methylene chloride, 5.00 parts dimethyl diphenyl polysiloxane (General Electric Co., Silicone SR-1153) are mixed well until a homogeneous solution is obtained.

The resulting solution is then processed further as set forth in Example 72.

EXAMPLE 93

20.00 parts Epocryl DRH-303 (Shell Chem. Co., diacrylate ester of liquid bisphenol A resin), 20.00 parts trimethylolpropane triacrylate, 12.00 parts pentaerythritol tetraacrylate, 20.00 parts neopentylglycol diacrylate, 15.00 parts 1,6-hexanediol diacrylate, 5.00 parts 2-hydroxyethyl acrylate, 6.00 parts acrylated epodidized soybean oil (Union Carbide Co., Actomer X-70), 10.00 parts benzoin isobutyl ether, and 2.00 parts cyclododecane, dissolved in 6.0 parts methylene chloride are mixed well until a homogeneous solution is obtained.

The resulting solution is then processed further as set forth in Example 72.

EXAMPLE 95

Ingredients 20.0 parts polypropylene glycol TP 340 triacrylate
15.0 parts trimethylolpropane triacrylate
15.0 parts pentaerythritol tetraacrylate
15.0 parts neopentylglycol diacrylate
15.0 parts 1,6-hexanediol diacrylate
10.0 parts 2-hydroxyethyl acrylate
5.0 parts acrylated epoxidized soybean oil (Union Carbide Co., Actomer X-70)
10.0 parts benzoin isobutyl ether
1.0 part cyclododecane, dissolved in 3.0 parts methylene chloride
4.0 parts dimethyl diphenyl polysiloxane (General Electric Silicone SF-1153).

EXAMPLE 96

Ingredients 212.0 parts Diglycidyl ether of bisphenol A
106.0 parts (3,4-epoxycyclohexyl)-methyl 3,4-epoxycyclohexane carboxylate.
3.18 parts Alkyl glycidyl ether in which alkyl groups are predominantly dodecyl and tetradecyl
4.0 parts propylene carbonate, containing dissolved 2.45 parts of p-chlorobenzene diazonium hexafluorophosphate as the catalyst precursor
0.75 part N,N-dimethyl acetamide as gelation inhibitor
3.0 parts cyclododecane dissolved in 9.0 parts methylene chloride
12.0 parts nonionic organosilicone fluid (Union Carbide L-522 Silicone).

EXAMPLE 97

Ingredients 212.0 parts Diglycidyl ether of bisphenol A
106.0 parts (3,4-epoxycyclohexyl)-methyl 3,4-epoxycyclohexane carboxylate
3.18 parts alkyl glycidyl ether in which alkyl groups are predominantly dodecyl and tetra decyl
4.0 parts propylene carbonate, containing dissolved 2.45 parts of p-chlorobenzene diazonium hexafluorophosphate as the catalyst precursor
0.75 part N,N-dimethyl acetamide as gelation inhibitor 3.0 parts Halocarbon wax 6.00 (Halocarbon Products Corp.).

EXAMPLE 98

Ingredients
534.0 parts bis (diallylamine) adduct of bis glycidyl ether of bisphenol A
488.0 parts pentaerythritol tetra-beta-mercaptopropionate
1.0 part dibenzosuberone
30.0 parts Halocarbon oil 437 (Halocarbon Products Corp

EXAMPLE 99

Ingredients
534.0 parts bis (diallyl amine) adduct of bisglycidyl ether of bisphenol A
488.0 parts pentaerythritol tetra-beta-mercaptopropionate
1.0 part dibenzosuberone
10.0 parts cyclododecane, dissolved in 30 parts methylene chloride
50.0 parts N-beta-aminoethyl-gamma-aminopropyltrimethoxy silane (Union Carbide Co., Silane A-1120).

EXAMPLE 100

Ingredients
584.0 parts bis(diallylamine) adduct of Epon 828 (Shell Chemical Co.; bis glycidyl ether of bisphenol A type resin with epoxy equivalent of approx. 195)
488.0 parts pentaerythritol tetra-beta-mercaptopropionate
1.5 parts dibenzosuberone
10.0 parts cyclododecane, dissolved in 30 parts methylene chloride
50.0 parts dimethyl diphenyl polysiloxane (General Electric Co., Silicone SF-1153).

EXAMPLE 101

Ingredients
20.0 parts diunsaturated polyetherurethane [made from 324 parts poly (tetra-methylene ether) glycol (Quaker Oats Co.; OH-No. 37.1 348 parts toluene diisocyanate, and 232 parts 2-hydroxy ethyl acrylate]
15.0 parts pentaerythritol tetra acrylate
15.0 parts trimethylol propane triacrylate
15.0 parts 1,6-Hexane diol diacrylate
15.0 parts neopentylcoldiacrylate
10.0 parts 2-hydroxyethyl acrylate
10.0 parts benzoin isobutyl ether
1.0 part cyclododecane, dissolved in 3.0 parts methylene chloride
2.0 parts Halocarbon oil 437 (Halocarbon Products Corp.

EXAMPLE 102

Ingredients
20.0 parts diunsaturated polyurethane [made from 458 parts adiprene L-100 (duPont) diisocyanate and 53.4 parts 2-hydroxyethyl acrylate]
15.0 parts pentaerythritol tetracrylate
15.0 parts trimethylol propane triacrylate
15.0 parts 1,6-hexanedioldiacrylate
15.0 parts neopentylglycol diacrylate
10.0 parts 2-hydroxyethylacrylate
10.0 parts benzoin isobutyl ether
1.0 part cyclododecane, dissolved in 3.0 parts methylene chloride
3.0 parts gamma-methacryl oxypropyltrimethoxy silane (Union Carbide Co., Silane A-174).

EXAMPLE 103

Ingredients
20.0 parts diunsaturated polyester-urethane [made from 323 parts polyesterdiol (RC polyester S 101-35 by Hooker Chemical Co.; MW 3232), 34.8 parts toluene-diisocyanate, and 23.2 parts 2-hydroxyethyl acrylate]
15.0 parts pentaerythritol tetra acrylate
15.0 parts trimethylol propane triacrylate
15.0 parts 1,6-hexane diol diacrylate
15.0 parts neopentyl glycol diacrylate
10.0 parts 2-hydroxyethyl acrylate
10.0 parts benzoin isobuty ether
1.0 part cyclododecane, dissolved in 3.0 parts methylene chloride
4.0 parts nonionic organosilicone fluid (Union Carbide Co., Silicone L-522).

EXAMPLE 104

30.0 parts acrylic ester (made from 1 mole glycerol, 2 moles glacial acrylic acid, 0.5 mole maleic anhydride, and 0.02 mole p-toluene sulfonic acid)
30.0 parts trimethylol propane triacrylate
15.0 parts pentaerythritol tetraacrylate
15.0 parts neopentylglycol diacrylate
15.0 parts 1,6-hexanediol diacrylate
10.0 parts 2-hydroxyethyl acrylate
5.0 parts acrylated epoxidized soybean oil (Union Carbide Co., Actomer X-70)
10.0 parts benzoin isobutyl ether
1.0 part cyclododecane, dissolved in 3.0 parts methylene chloride
3.0 parts N-beta-aminoethyl-gamma-aminopropyltrimethoxy silane (Union Carbide Co., Silane A-1120).

Examples 105–114 illustrate coatings and films which are radiation curable and which have good film strength, good adhesion, good abrasion and solvent resistance, and which can also be cast to reproduce with good fidelity the surface over which they are cast. They incorporate, in the radiation curable films as herein disclosed, other essentially linear polymers of generally higher molecular weight which are soluble in the radiation-curable liquid composition. They should have a molecular weight of at least about 2,000 up to the limit of solubility, and preferably about 10,000 to 20,000. These polymers add bulk, strength, and control shrinkage in the cured composite films. The added polymers are pre-polymerized and generally do not react during radiation curing, although they can advantageously include reactive groups, such as ethylenic unsaturation, for example, as end groups, which will co-polymerize during curing. By inclusion of a wax or wax-like material of limited compatibility as herein disclosed, and which migrate to the surface, an oxygen barrier is provided which permits the films to be cured in the presence of oxygen, e.g., in air, and which provide films with release properties.

EXAMPLE 105

The following ingredients are mixed well, all parts being by weight.
11.4 parts unsaturated polyether-polyurethane prepolymer, prepared from 1 mole polyether triol, 3 moles 2,4 toluenediisocyanate, and 3 moles 2-hydroxyethyl acrylate, according to Example 1 above
17.35 parts trimethylol propane triacrylate
10.65 parts neopentyl glycol diacrylate
2.4 parts acrylated epoxidized soybean oil (ACTOMER X-70, Union Carbide Corp.)
3.95 parts 2-hydroxyethyl acrylate
0.45 parts cyclododecane, dissolved in 2.3 parts methylene chloride
50.0 parts methyl methacrylate copolymer, 40% solids in a mixture of toluene and isopropanol (ELVACITE 6014, DuPont).

After mixing well, the solvents are removed at room temperature in the dark, under reduced pressure, and in the presence of copper shaving as polymerization inhibitor. Thereafter, the following ingredients are added.
6.0 parts benzoin isobutyl ether (photoinitiator)
2.15 parts N-beta (aminoethyl)-gamma-aminopropyl trimethoxy silane (Silane A-1120, Union Carbide Corp.), (a limited-compatibility material). The resulting liquid composition can be coated as hereinbefore described. It can also be cast, e.g. over an optical reflective pattern on a steel surface, with or without release agent, rapidly cured with radiation and stripped to provide a self-supporting film containing on one surface a good replica of the optical pattern.

EXAMPLES 106–114

Examples 106–114 below illustrate other additional polymers which can be substituted for ELVACITE 6104 in Example 105 to provide, by the same procedure, good radiation curable casting films and release films or coatings.

TABLE I

| Example No. | Parts | Ingredients |
|---|---|---|
| 106 | 17.0 | G-CURE 869 S, General Mills Chemicals Inc., a hydroxy functional acrylic copolymer, 60% solids in a mixture of xylene and cellosolve acetate. |
| 107 | 10.0 | PM Polymer (Phillips Petroleum Co., a mercaptan terminated hydrocarbon polymer). |
| 108 | 42.0 | Bakelite T-24-g (Union Carbide Corp., a vinyl alcohol-vinyl acetate copolymer, 25% solids in toluene). |
| 109 | 40.0 | Bakelite Vinyl Butyral XYLS-4 (Union Carbide Corp., 25% solids). |
| 110 | 10.0 | Polyketone Resin 250 (Union Carbide Corp., dissolved in 50 parts toluene |
| 111 | 17.0 | Spencer-Kellogg DV-2230, an aliphatic polyurethane lacquer, 30% solids in mixture of tetrahydrofuran and isopropanol. |
| 112 | 10.0 | Castomer P-0010 (Witco Chemical Co., an unsaturated polyurethane dissolve in 50 parts methylene chloride. |
| 113 | 20.0 | Acryloid AT-71 (Rohm & Haas Co., a polyacrylate with carboxyl functionality, 50% solids). |
| 114 | 20.0 | Acryloid AT-63 (Rohm & Haas Co., a polyacrylate with hydroxyl functionality, 50% soldis in xylene). |

In the reactive polyamide prepolymers herein described, the polyamide should have primary amine end groups and at least one secondary amine in the polymer chain. They are prepared, for example, from essentially saturated dibasic acids such as dimerized fatty acids and triamines such as diethylene triamine, excess amine being employed to provide amine end groups. Each reactive polyamide resin molecule is, according to this invention, reacted with at least three molecules of an unsaturated dibasic acid, reaction being terminated when the acid molecule has formed one amide linkage and before significant cross-linking occurs. The useful unsaturated dibasic acids are maleic, fumaric, itaconic and 5-norbornene-2,3 -dicarboxylic acids, or their lower alkyl ester or anhydrides thereof. The unsaturated groups of these acids co-polymerize with radiation polymerizable vinyl monomers to provide radiation cured films, but do not react with the amine groups of the reactive polyamine when condensed therewith. These prepolymers are especially useful as inks and can be diluted with vinyl monomers including acrylates, styrene, vinyl ethers, vinyl acetate, and the like which can be radiation co-polymerized therewith.

EXAMPLE 115

Coating with Oxygen-barrier Properties 39.5 parts reaction product from Example 3, 23.3 parts trimethylolpropane triacrylate, 23.3 parts neopentyl glycol diacrylate, 8.7 parts 2-hydroxyethyl acrylate, and 28.0 parts of a 25% solution of vinylidene chloride-acrylonitrile copolymer (Saran F-310, Dow Chemical Company) in methylethyl ketone are mixed well. Then the methyl ethyl ketone solvent is removed at room temperature under reduced pressure. To the solvent free residue is added 8.0 parts benzoin isobutyl ether. The composition is mixed on a roller mill and a colorless medium oil is obtained. Films are applied and cured as shown in Example 10. The cured films have more than twice the oxygen-barrier properties compared with an identical film without the Saran F-310.

EXAMPLE 116

Coating with Oxygen-barrier Properties 39.5 parts reaction product from Example 3, 23.3 parts trimethylolpropane triacrylate, 23.3 parts neopentyl glycol diacrylate, 8.7 parts 2-hydroxyethyl acrylate, and 4 parts of cyclododecane are mixed on a roller mill until a clear, colorless light oil is obtained. Then 8 parts of benzoin isobutyl ether are added and the milling is continued for a short while. Films are applied and cured as shown in Example 10. The cured films have more than twice the oxygen barrier properties compared with an identical film without the cyclododecane.

EXAMPLE 117

Coating with Oxygen-barrier Properties

Ingredients:
212.0 parts Diglycidyl ether of bisphenol A
106.0 parts (3,4-epoxycyclohexyl)-methyl 3,4-epoxycyclohexane carboxylate
3.18 parts Alkyl glycidyl ether in which alkyl groups are predominantly dodecyl and tetradecyl
4.0 parts propylene carbonate, containing dissolved 2.45 parts of p-chlorobenzene diazomium hexafluorophosphate as the catalyst precursor
0.75 parts N,N-dimethyl acetamide as gelation inhibitor
13.2 parts cyclododecane dissolved in 13.0 parts methylene chloride

EXAMPLE 118

Coating with Oxygen-barrier properties

Ingredients
212.0 parts Diglycidyl ether of bisphenol A 106.0 parts (3,4-epoxycyclohexyl)-methyl 3,4-epoxycyclohexane carboxylate.
3.18 parts Alkyl glycidyl ether in which alkyl groups are predominantly dodecyl and tetradecyl
4.0 parts propylene carbonate, containing dissolved 2.45 parts of p-chlorobenzene diazomium hexafluorophosphate as the catalyst precursor
0.75 parts N,N-dimethyl acetamide as gelation inhibitor
100.0 parts of a 25% solution of vinylidene chloride-acrylonitrile copolymer (Saran F-310, Dow Chemical Co.) in methylethyl ketone are mixed well. Then the methylethyl ketone is removed at room temperature under reduced pressure.

EXAMPLE 119

Coating with Oxygen-barrier properties

Ingredients
534.0 parts bis (diallyl amine) adduct of bisglycidyl ether of bisphenol A
488.0 parts pentaerythritol tetra-beta-mecaptopropionate
1.0 part dibenzosuberone
40.0 parts cyclododecane, dissolved in 40 parts methylene chloride

EXAMPLE 120

Coating with Oxygen-barrier properties

Ingredients
534.0 parts bis (diallyl amine) adduct of bisglycidyl ether of bisphenol A
488.0 parts pentaerythritol tetra-beta-mecaptopropionate 1.0 part dibenzosuberone
280.0 parts of a 25% solution of vinylidene chloride-acrylonitrile copolymer (Saran F-310; Dow Chemical Co.) in methyl ethyl ketone are mixed well. Then the methyl ethyl ketone is removed at room temperature under reduced pressure.

What is claimed is:

1. A method of producing a durable coating on the surface of a solid comprising the steps of:
    modifying a polyamide containing primary and/or secondary amine groups, (internally and/or terminally) with unsaturated esters, anhydrides, and/or acids in ratios from 2:1 to 10:1 (unsaturated ester, acid or anhydride: polyamide) thereby obtaining an unsaturated prepolymer which will copolymerize with acrylic and/or methacrylic monomers,
    mixing with said prepolymer, as so modified, a quantity of acrylic and/or methacrylic monomer ester material, vinyl acetate, and/or vinyl pyrolidone, in proportion between about 1:1 and 1:20 (modified prepolymer to monomer ester);
    coating said mixture on the surface of a sheet, plate or other solid body, and
    irradiating said coating, as sensitized, with actinic radiation or, as unsensitized, with an electron beam, to produce a cured film.

2. A radiation curable pre-polymer method as defined in claim 1 in which:
    said acrylate material is one selected from the group consisting of trimethylolpropane triacrylate, tetraethylene glycol diacrylate and acrylic acid, hydroxyethyl acrylate, neopentyl glycol diacrylate, acrylated epoxidized soybean oil, hexanediol diacrylate, 1,4-butanediol diacrylate, pentaerythritol tetraacrylate, pentaerythritol triacrylate, butyl acrylate, isodecylacrylate, octadecyl acrylate, corresponding methacrylates, and mixtures of two or more of them.
    modifying a polyamide containing primary and/or secondary amine groups, (internally and/or terminally) with unsaturated esters, anhydrides, and/or acids in ratios from 2:1 to 10:1 (unsaturated ester, acid or anhydride: polyamide) thereby obtaining an unsaturated prepolymer which will copolymerize with acrylic and/or methacrylic monomers,
    mixing with said prepolymer, as so modified, a quantity of acrylic and/or methacrylic monomer ester material, vinyl acetate, and/or vinyl pyrolidone, in proportion between about 1:1 and 1:20 (modified prepolymer to monomer ester);
    coating said mixture on the surface of a sheet, plate or other solid body, and
    irradiating said coating, as sensitized, with actinic radiation or, as unsensitized, with an electron beam, to produce a cured film.

3. A method of producing a release coating for pressure sensitive adhesion or for transfer printing which is a method as defined in claim 1 in which method a small quantity of a hydrocarbon wax, oleamide, polysiloxane, silicone or silane, or of two or more of them is added to the mixture when said acrylic monomer ester material is mixed with said prepolymer.

4. A method of producing a durable coating as defined in claim 1 in which said prepolymer is a modified polyamide with primary and/or secondary amine groups, produced by heating a methyl or ethyl ester or mixed methyl and ethyl esters of one or more dicarboxy unsaturated acids, followed by evaporating off methanol, ethanol or both, and excess ethyl or methyl esters or both, completing such evaporation at low pressure in the presence of a small quantity of p-methoxyphenyl to inhibit premature polymerization.

5. A method of producing a durable coating as defined in claim 4 in which said ester of a dicarboxy unsaturated acid is a substance selected from the group consisting of dimethyl maleate, diethyl maleate, dimethyl fumarate, diethyl fumarate, dimethyl itaconate and mixtures thereof.

6. A method of producing a durable coating as defined in claim 1 in which said modified prepolymer is obtained by heating an unsaturated dicarboxylic acid or an anhydride of such an acid with a polyamide amine and in which after the reaction so produced a small quantity of p-methoxyphenol is added to prevent premature further polymerization.

7. A method of producing a durable coating as defined in claim 1 in which said modified prepolymer is obtained by heating 5-norbornene-2, 3 dicarboxyl anhydride with a polyamide amine, and then allowing the material to cool in the presence of a small quantity of p-methoxyphenol.

8. A method of producing a durable coating as defined in claim 1 in which said modified prepolymer is obtained by heating a polyamide polyamine with an ethyl or methyl ester, or both, of an unsaturated dicarboxylic acid, or 5-norbornene-2, 3 dicarboxylic acid, stripping off volatile material at a pressure of a fraction of a millimeter of mercury, followed by allowing the reaction product to cool in the presence of a small quantity of p-methoxyphenol.

9. A method of producing a durable coating as defined in claim 1 in which said modified prepolymer is a reaction product of a polyamide polyamine and a substance selected from the group consisting of ethyl and methyl esters of maleic, fumaric and itaconic acids and of 5-norbornene-2,3 dicarboxylic acid and anhydrides of such acids and mixtures thereof.

10. A method of producing a durable coating as defined in claim 1 in which said acrylic or methacrylic monomer ester material comprises one or more substances selected from the group consisting of trimethylolpropane triacrylate, hydroxyethyl methacrylate, neopentyl glycol diacrylate, acrylated epoxidized soybean oil, trimethylolpropane triacrylate, pentaerythritol, tri or tetraacrylate tetracthylene glycol diacrylate vinylacetate, vinylpynolidone, hydroxyethylacrylate, 1,6-hexanediol diacrylate, neopentylglycol diacrylate, as well as the corresponding methacrylates, and an oxygen-barrier material such as stearyl acrylate.

11. A method of producing a durable coating as defined in claim 10 in which said acrylic monomer ester material comprises trimethylolpropane triacrylate and hydroxyethyl acrylate and includes an admixture of a sensitizer or initiator and a hydrocarbon, ester, or fluorocarbon wax, a waxy higher alkyl alcohol or acid, oleamide, polysiloxane or silane, or silicone, and in which the mixture is coated on a flexible sheet at a thickness in the range from about 0.1 to about 2.0 mils and thereafter exposed for at least 0.1 second to ultraviolet radiation of a medium pressure mercury lamp.

12. A method of producing a durable coating as defined in claim 10 in which said acrylic or methacrylic monomer ester material comprises trimethylolpropane triacrylate, acrylated epoxidized soybean oil, hexanediol diacrylate and stearyl acrylate and the resulting mixture is applied to a thickness in the range from about 0.1 to about 6 mils to a solid surface and thereafter exposed to 5 Mrad of electron beam irradiation in vacuum.

13. A method of producing a durable coating as defined in claim 10 in the form of ink applied to a surface by printing, in which said acrylic monomer ester material comprises trimethylol propane triacrylate, in which a pigment and a small quantity of stearyl acrylate is mixed in at the same time and in which thereafter a sensitizer or photoinitiator is mixed in, after which the resulting mixture is applied by printing as an ink with a film thickness between about 0.01 to about 0.4 mils to a surface to be printed, after which the printed surface is exposed for at least 0.1 second to ultraviolet radiation from a medium pressure mercury lamp.

* * * * *